(12) United States Patent
Liu

(10) Patent No.: US 7,761,978 B2
(45) Date of Patent: Jul. 27, 2010

(54) ASSEMBLING APPARATUS

(75) Inventor: Cheng Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/350,232

(22) Filed: Jan. 8, 2009

(65) Prior Publication Data

US 2010/0050424 A1    Mar. 4, 2010

(30) Foreign Application Priority Data

Sep. 1, 2008    (CN) .................... 2008 1 0304330

(51) Int. Cl.
*B23P 19/00* (2006.01)
(52) U.S. Cl. .................... 29/739; 29/757; 29/758; 29/759; 29/760; 29/740

(58) Field of Classification Search ............... 29/739, 29/740, 757, 758, 759, 760; 414/752.1
See application file for complete search history.

(56) References Cited

U.S. PATENT DOCUMENTS 5,218,753 A * 6/1993 Suzuki et al. ................ 29/740
6,256,869 B1 * 7/2001 Asai et al. .................... 29/740

* cited by examiner

*Primary Examiner*—Derris H Banks
*Assistant Examiner*—Azm Parvez
(74) *Attorney, Agent, or Firm*—Zhigang Ma

(57) ABSTRACT

An assembling apparatus for assembling an electronic component to a printed circuit board (PCB) includes a base, a fixing member fixed to the base, a sliding member slidably mounted to the base, and a driving device mounted to the base. The fixing member is configured for fixing the PCB. The sliding member is configured for supporting the electronic component. The driving device is capable of driving the sliding member to move relative to the fixing member to assemble the electronic component to the PCB.

19 Claims, 4 Drawing Sheets

ASSEMBLING APPARATUS

BACKGROUND

1. Technical Field

The present disclosure relates to assembling apparatuses, and more particularly, to an assembling apparatus for assembling an electronic component to a printed circuit board (PCB).

2. Description of Related Art

Generally, an electronic component, such as a connector, is manually assembled onto a PCB. For example, the connector and the PCB are placed on two objects that are capable of moving relative to each other. One object is manually moved towards the other object to assemble the connector to the PCB. However, manually assembling the connector to the PCB is time-consuming, and may easily lead to misalignment between the electrical contacts of the connector and the electrical contacts of the PCB.

DETAILED DESCRIPTION

Figure 1:
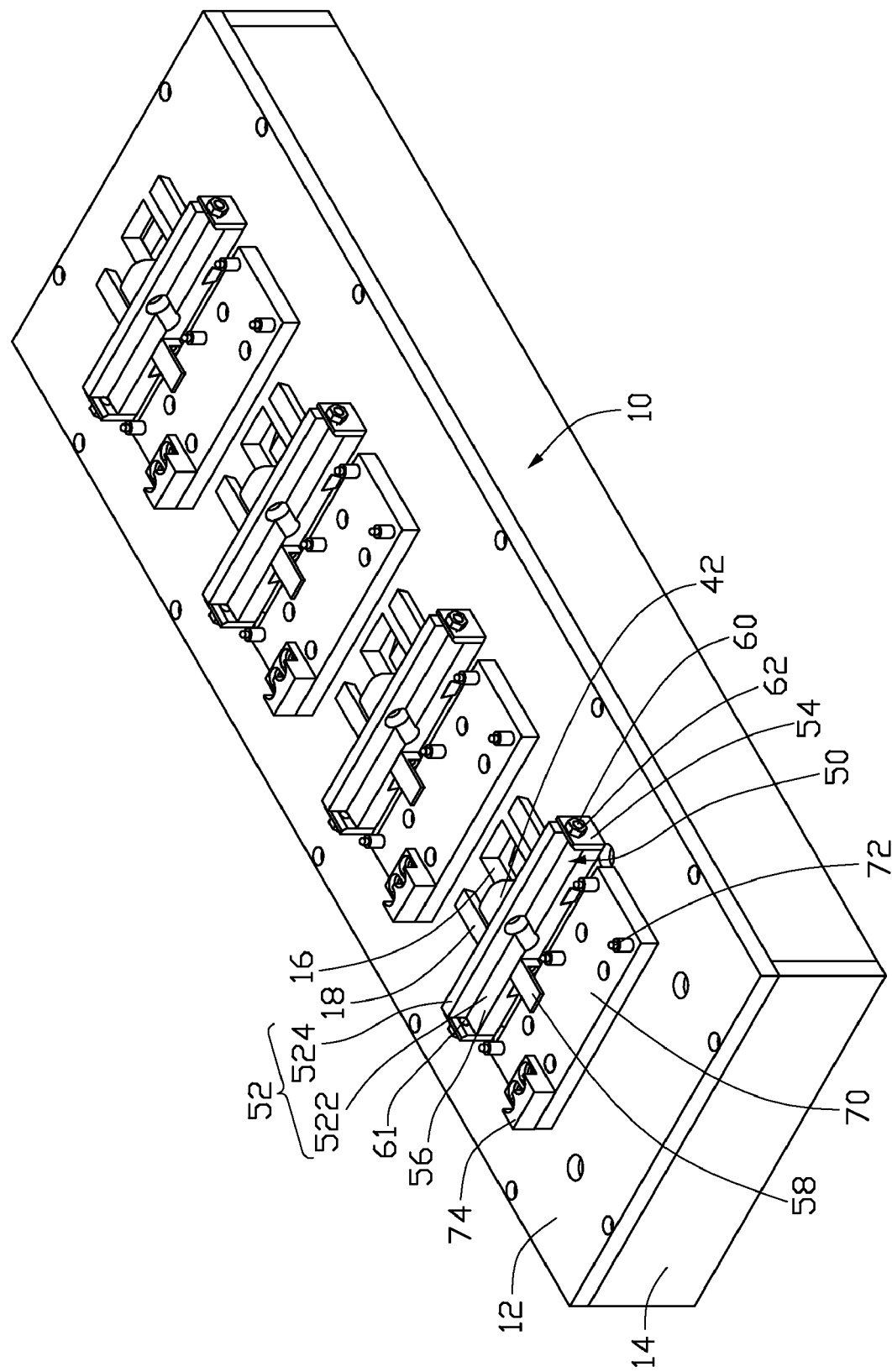
FIG. 1 is an isometric view of an exemplary embodiment of an assembling apparatus for assembling an electronic component to a printed circuit board.
Figure 2:
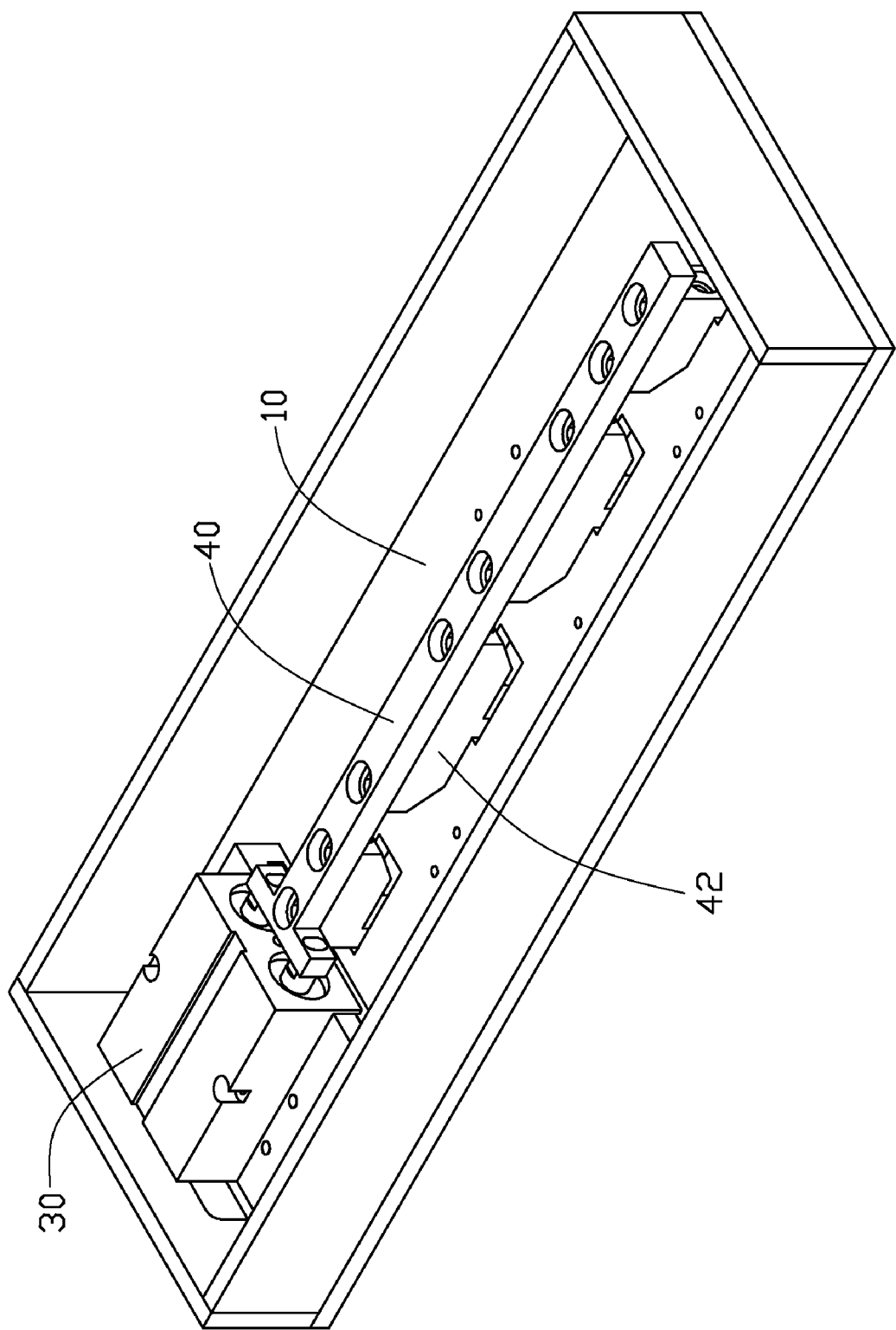
FIG. 2 is an inverted isometric view of the assembling apparatus of FIG. 1.
Figure 3:
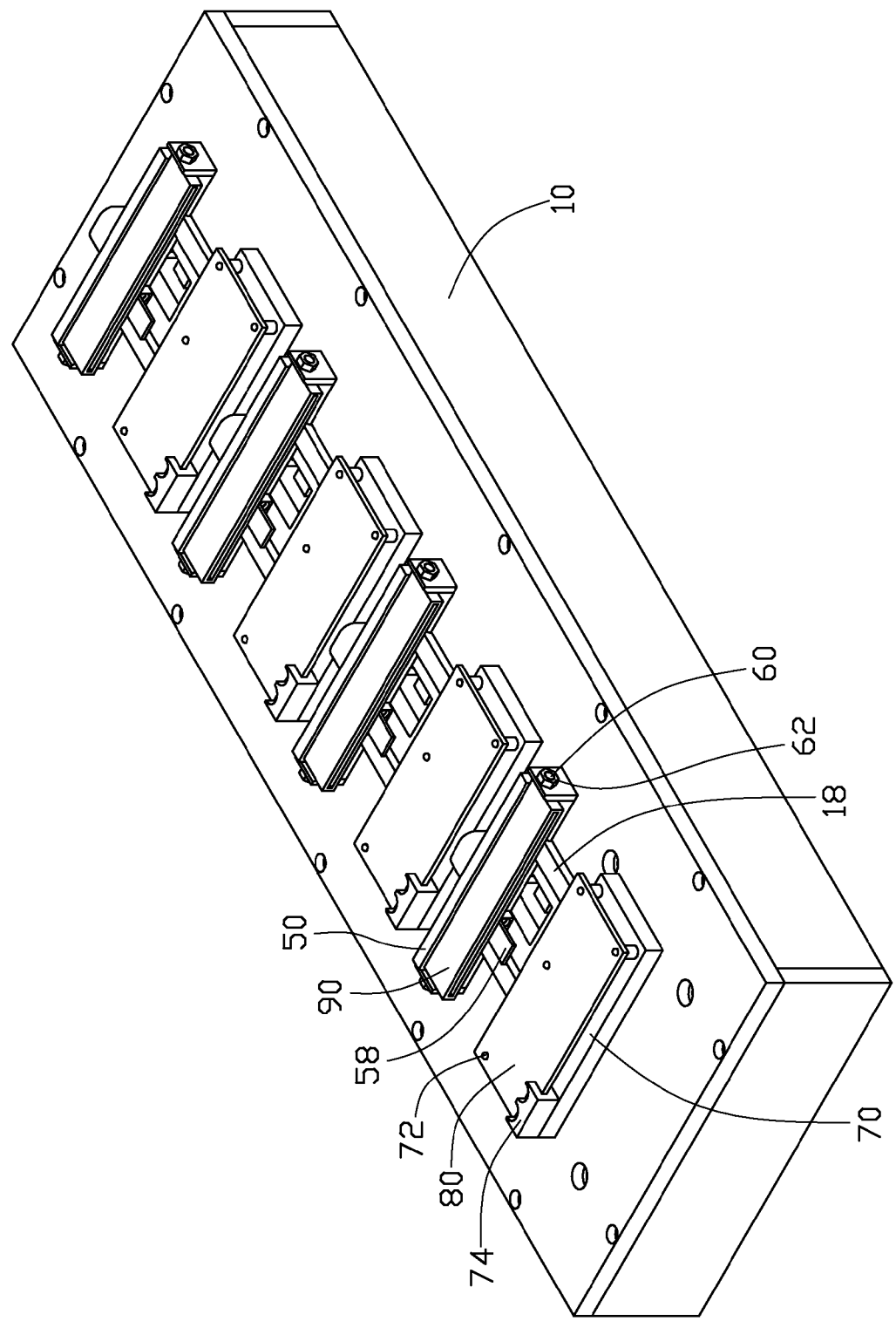
FIG. 3 is similar to FIG. 1, but showing the electronic component is ready to be assembled to the printed circuit board.

Referring to FIGS. 1 to 3, an exemplary embodiment of an assembling apparatus is disclosed to assemble a plurality of electronic components, such as a plurality of connectors 90, to a plurality of printed circuit boards (PCBs) 80. The assembling apparatus includes a base 10, a driving device, a pole 40 connected to and driven by the driving device, a plurality of sliding members 50, and a plurality of fixing members 70. The driving device may be a motor, an air cylinder, or a hydraulic cylinder. In one embodiment, the driving device is an air cylinder 30.

The base 10 is rectangularly-shaped and includes a top wall 12 and four sidewalls 14 perpendicularly extending down from four sides of the top wall 12. The top wall 12 defines a plurality of linearly arranged spaced sliding slots 16. Two rails 18 are mounted to the top wall 12 at opposite sides of each sliding slot 16.

The air cylinder 30 is mounted on the underside of the top wall 12 and opposite to the rails 18. The pole 40 is connected to a cylinder rod of the air cylinder 30. The pole 40 includes a plurality of protrusions 42, each protrusion 42 extending into a sliding slot 16 of the top wall 12 to be exposed and capable of sliding in the sliding slot 16.

Each sliding member 50 includes a sliding block 52, two limiting blocks 54 attached to opposite ends of the sliding block 52, two spring bolt assemblies 60, and two nuts 62. The sliding block 52 is generally L-shaped, and includes a horizontal part 522 and a vertical part 524 perpendicularly extending up from a side of the horizontal part 522. The sliding block 52 and the limiting blocks 54 bound a receiving space 56 to receive the connector 90. A cantilevered supporting portion 58 horizontally extends from a side of the horizontal part 522 of the sliding block 52 opposite to the vertical part 524, and is coplanar with the top of the horizontal part 522 to support the connector 90. The sliding block 52 is fixed to a corresponding protrusion 42 via the vertical part 524. The bottom of the horizontal part 522 defines two slots (not shown) configured to slidably receive the rails 18 at a corresponding sliding slot 16, to make the sliding block 52 be slidably mounted to the top wall 12 of the base 10. Therefore, when the air cylinder 30 drives the pole 40 to move back and forth, the protrusions 42 of the pole 40 drive the sliding blocks 52 to slide along the corresponding rails 18. Each spring bolt assembly 60 is screwed into a threaded through hole, via a threaded bolt thereof, defined in a corresponding limiting block 54, and a longitudinal hole is defined in the threaded bolt for receiving a spring and a steel ball 61. The steel ball 61 extends into the receiving space 56 from the spring bolt assembly 60. Diameters of the ends of the longitudinal holes in the threaded bolts are smaller than between the ends to allow portions of the steel balls 61 to extend into the receiving space 56 without falling out of the threaded bolts. The springs received in the threaded bolts are configured to bias the steel balls toward the receiving space 56. The spring bolt assemblies 60 are aligned with each other. A distance between the steel balls 61 of the spring bolt assemblies 60 is adjustable by adjusting how far the spring bolt assemblies 60 are screwed into the threaded through holes of the limiting blocks 54.

Each fixing member 70 is fixed to the top wall 12 opposite to a corresponding protrusion 42 across the sliding member 50. The fixing member 70 includes a plurality of posts 72 to support a corresponding PCB 80. An L-shaped supporting block 74 protrudes up from a side of the fixing member 70, opposite to the sliding member 50.

The connector 90 is received in the receiving space 56 of the sliding block 52 and sandwiched between opposing steel balls 61 by adjustment of the spring bolt assemblies 60. The PCB 80 is fixed to the plurality of posts 72 of the fixing member 70 via a plurality of through holes defined in the PCB 80, with a side of the PCB 80 resisting against the supporting block 74. The air cylinder 30 drives the pole 40 to move the sliding member 50 to slide along the rails 18 toward the fixing member 70, until the electrical contacts of the connector 90 engage with the electrical contacts of the PCB 80. The spring bolt assemblies 60 may be adjusted repeatedly so that the error of alignment between the electrical contacts of the connector 90 and the electrical contacts of the PCB 80 is reduced. The spring bolt assemblies 60 are fixed in place by the nuts 62. The air cylinder 30 drives the pole 40 to move back, resulting in the sliding member 50 moving away from the fixing member 70. The supporting portion 58 can support the connector 90 after the sliding member 50 moves away from the fixing member 70, to prevent the connector 90 from being slantwise because of gravity, therefore avoiding misalignment between the connector 90 and the PCB 80.

The assembled connector 90 and PCB 80 are released from the fixing member 70. The error of alignment between the electrical contacts of the connector 90 and the electrical contacts of the PCB 80 is tested to determine whether a desired alignment. If the alignment is not desired, the spring bolt assemblies 60 are adjusted to make the steel balls 61 sandwich the connector 90 to assemble the connector 90 to the PCB 80 again. The error of alignment is tested again, until desired alignment is achieved.

Figure 4:
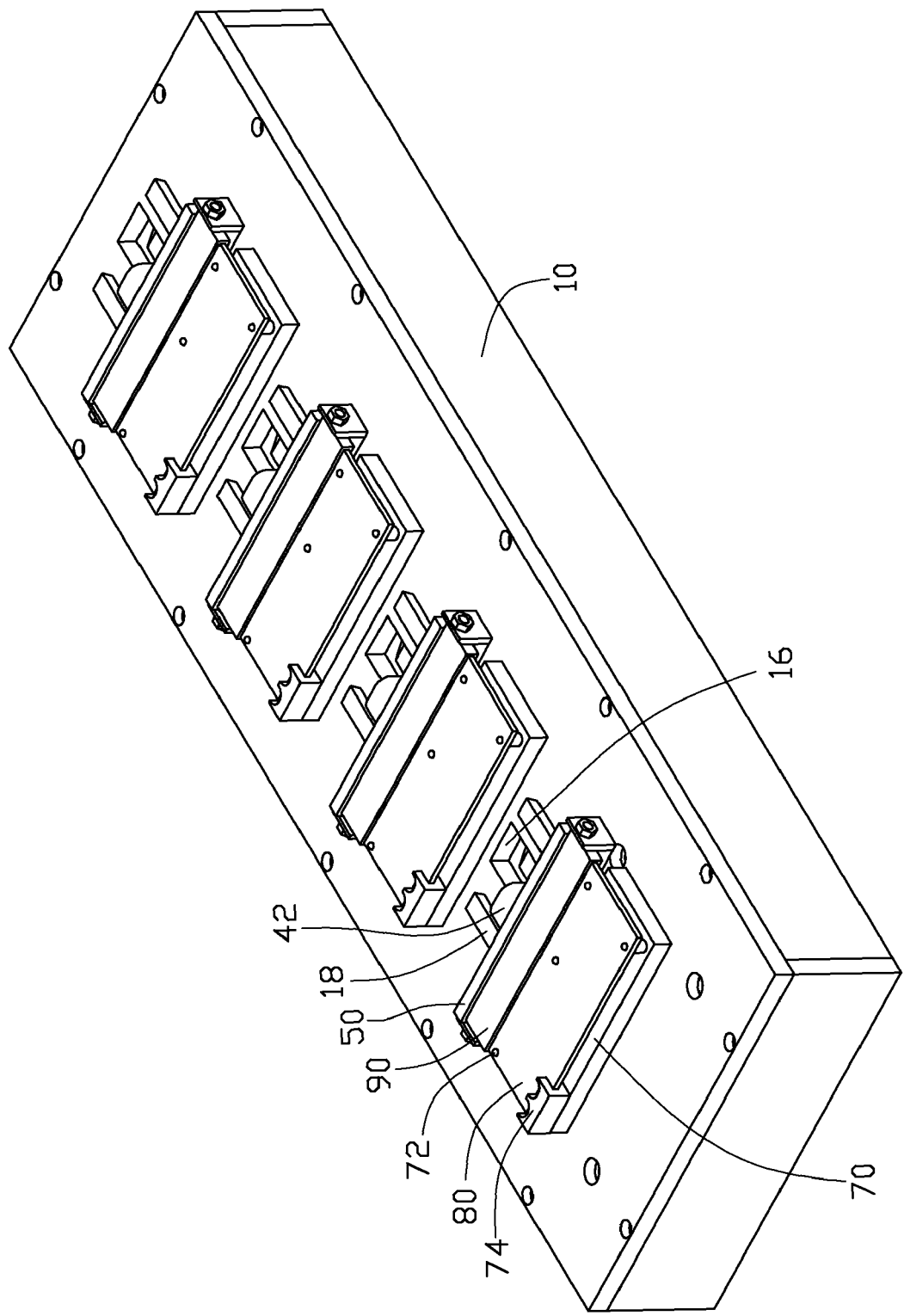
FIG. 4 is similar to FIG. 3, but showing the electronic component assembled on the printed circuit board.

Upon the achievement of desired alignment, the sliding member 50 is ready to mount a plurality of connectors to assemble the plurality of connectors to a plurality of PCBs, as shown in FIG. 4.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. An assembling apparatus for assembling an electronic component to a printed circuited board (PCB), the assembling apparatus comprising:
   a base;
   a fixing member fixed to the base, configured for fixing the PCB to the base;
   a sliding member slidably mounted to the base, configured for supporting the electronic component; and
   a driving device mounted to the base, capable of driving the sliding member to move relative to the fixing member, to assemble the electronic component to the PCB;
   wherein the sliding member defines a receiving space configured for receiving the electronic component, two spring bolt assemblies are mounted to the sliding member to allow the electronic component to be adjustably sandwiched therebetween.

2. The assembling apparatus of claim 1, wherein a pole is mounted to the driving device, the pole having a protrusion protruding from the pole, wherein the sliding member is fixed to the protrusion to slide with the pole driven by the driving device.

3. The assembling apparatus of claim 2, wherein the base comprises a top wall comprising two parallel rails mounted to the top wall, wherein the sliding member is slidably mounted to the rails.

4. The assembling apparatus of claim 3, wherein the top wall defines a sliding slot between the rails, the driving device and the pole are mounted on the underside of the top wall, the protrusion extending up through the sliding slot to be fixed to the sliding member.

5. The assembling apparatus of claim 1, wherein the sliding member comprises a sliding block and two limiting blocks mounted to opposite ends of the sliding block, the sliding block and the limiting blocks bound the receiving space, the spring bolt assemblies are mounted to the limiting blocks respectively.

6. The assembling apparatus of claim 5, wherein the sliding block is generally L-shaped and comprises a horizontal part and a vertical part extending up from a side of the horizontal part, wherein a supporting portion extends horizontally from a side of the horizontal part opposite to the vertical part and is coplanar with the top of the horizontal part to support the electronic component.

7. The assembling apparatus of claim 1, wherein the driving device is an air cylinder.

8. The assembling apparatus of claim 1, wherein the fixing member comprises a plurality of posts to support and position the PCB.

9. The assembling apparatus of claim 8, wherein an L-shaped supporting block protrudes from the fixing member to resist against a side of the PCB to fix the PCB together with the posts.

10. An assembling apparatus for assembling an electronic component to a printed circuit board (PCB), the assembling apparatus comprising:
    a base defining a through sliding slot;
    a fixing member fixed to the top of the base, configured for fixing the PCB to the base;
    a sliding member slidably mounted to the top of the base, configured for supporting the electronic component;
    a driving device mounted to the underside of the base; and
    a pole connected to the driving device, wherein the pole comprises a protrusion extending up from the underside of the base through the sliding slot of the base to be fixed to the sliding member, the pole is capable of being driven by the driving device to move with the sliding member toward the fixing member, to assemble the electronic component to the PCB.

11. The assembling apparatus of claim 10, wherein the base comprises a top wall defining the sliding slot, the sliding member and the fixing member are mounted to the top of the top wall, the driving device and the pole are mounted to the underside of the top wall.

12. The assembling apparatus of claim 11, wherein two parallel rails are mounted to the top of the top wall, wherein the sliding member is mounted to the rails and capable of moving along the rails.

13. The assembling apparatus of claim 10, wherein the sliding member defines a receiving space to receive the electronic component.

14. The assembling apparatus of claim 13, wherein the sliding member comprises a sliding block and two limiting blocks mounted to opposite ends of the sliding block, the sliding block and the limiting blocks bound the receiving space.

15. The assembling apparatus of claim 14, wherein two spring bolt assemblies are screwed into the limiting blocks respectively, each spring bolt assembly comprises a steel ball elastically extending into the receiving space, the steel balls of the spring bolt assemblies are configured for adjustably sandwiching opposite ends of the electronic component.

16. The assembling apparatus of claim 14, wherein the sliding block is L-shaped and comprises a horizontal part and a vertical part extending up from a side of the horizontal part, wherein a supporting portion extends horizontally from a side of the horizontal part opposite to the vertical part and is coplanar with the top of the horizontal part to supporting the electronic component.

17. The assembling apparatus of claim 10, wherein the driving device is an air cylinder.

18. The assembling of claim 10, wherein the fixing member comprises a plurality of posts to support the PCB.

19. The assembling apparatus of claim 18, wherein an L-shaped supporting block protrudes from the fixing member opposite to the sliding member, allowing a side of the PCB to resist against the supporting block to fix the PCB to the base together with the posts.

* * * * *